United States Patent
Sung et al.

(10) Patent No.: US 10,121,861 B2
(45) Date of Patent: Nov. 6, 2018

(54) NANOWIRE TRANSISTOR FABRICATION WITH HARDMASK LAYERS

(71) Applicant: Intel Corporation, Santa Clara, CA (US)

(72) Inventors: Seung Hoon Sung, Beaverton, OR (US); Seiyon Kim, Portland, OR (US); Kelin Kuhn, Aloha, OR (US); Willy Rachmady, Beaverton, OR (US); Jack Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/996,850

(22) PCT Filed: Mar. 15, 2013

(86) PCT No.: PCT/US2013/031942
§ 371 (c)(1),
(2) Date: Jun. 21, 2013

(87) PCT Pub. No.: WO2014/065866
PCT Pub. Date: May 1, 2014

(65) Prior Publication Data
US 2015/0129830 A1    May 14, 2015

(51) Int. Cl.
*H01L 29/06* (2006.01)
*H01L 29/10* (2006.01)
(Continued)

(52) U.S. Cl.
CPC ............ *H01L 29/1033* (2013.01); *B41F 3/46* (2013.01); *B41F 17/08* (2013.01); *B41N 10/04* (2013.01);
(Continued)

(58) Field of Classification Search
CPC ............. H01L 29/0669; H01L 29/0673; H01L 2924/13086
See application file for complete search history.

(56) References Cited

U.S. PATENT DOCUMENTS 7,456,476 B2 * 11/2008 Hareland .......... H01L 29/42384
257/349
7,923,337 B2    4/2011 Chang et al.
(Continued)

FOREIGN PATENT DOCUMENTS

CN    102428564 A    4/2012
JP    2009-088533 A    4/2009
(Continued)

OTHER PUBLICATIONS

International Search Report and Written Opinion received for PCT Patent Application No. PCT/US2013/031943, dated Dec. 23, 2013, 10 Pages.
(Continued)

*Primary Examiner* — Lynne Gurley
*Assistant Examiner* — Peter M Albrecht
(74) *Attorney, Agent, or Firm* — Green, Howard, & Mughal LLP

(57) ABSTRACT

A nanowire device of the present description may be produced with the incorporation of at least one hardmask during the fabrication of at least one nanowire transistor in order to assist in protecting an uppermost channel nanowire from damage that may result from fabrication processes, such as those used in a replacement metal gate process and/or the nanowire release process. The use of at least one hardmask may result in a substantially damage free uppermost channel nanowire in a multi-stacked nanowire transistor, which may improve the uniformity of the channel nanowires and the reliability of the overall multi-stacked nanowire transistor.

13 Claims, 18 Drawing Sheets

(51) Int. Cl.
*B41F 3/46* (2006.01)
*B41F 17/08* (2006.01)
*B41N 10/04* (2006.01)
*H01L 21/033* (2006.01)
*H01L 29/66* (2006.01)
*H01L 29/78* (2006.01)

(52) U.S. Cl.
CPC ...... *H01L 21/0332* (2013.01); *H01L 29/0673* (2013.01); *H01L 29/6656* (2013.01); *H01L 29/66545* (2013.01); *H01L 29/66795* (2013.01); *H01L 29/785* (2013.01); *B41N 2210/04* (2013.01); *B41N 2210/14* (2013.01); *Y10T 156/10* (2015.01)

(56) References Cited

U.S. PATENT DOCUMENTS

| | | | | |
|---|---|---|---|---|
| 7,999,251 | B2* | 8/2011 | Chu | B82Y 10/00 257/29 |
| 8,900,959 | B2* | 12/2014 | Chang | H01L 29/66439 257/213 |
| 2007/0284613 | A1* | 12/2007 | Chui et al. | 257/192 |
| 2008/0079041 | A1* | 4/2008 | Suk | B82Y 10/00 257/288 |
| 2008/0099849 | A1* | 5/2008 | Kim et al. | 257/365 |
| 2009/0061568 | A1* | 3/2009 | Bangsaruntip | B82Y 10/00 438/151 |
| 2009/0212330 | A1 | 8/2009 | Bernard et al. | |
| 2010/0207208 | A1 | 8/2010 | Bedell et al. | |
| 2010/0295020 | A1* | 11/2010 | Barwicz et al. | 257/24 |
| 2010/0295021 | A1* | 11/2010 | Chang et al. | 257/24 |
| 2011/0012090 | A1* | 1/2011 | Singh et al. | 257/24 |
| 2011/0303972 | A1* | 12/2011 | Saitoh et al. | 257/329 |
| 2012/0319178 | A1 | 12/2012 | Chang et al. | |
| 2014/0151639 | A1* | 6/2014 | Chang | H01L 29/42392 257/27 |

FOREIGN PATENT DOCUMENTS

| | | |
|---|---|---|
| KR | 10-2006-0022414 A | 3/2006 |
| KR | 10-0763542 B1 | 9/2007 |
| WO | 2014/142950 A1 | 9/2014 |

OTHER PUBLICATIONS

International Preliminary Report on Patentability and Written Opinion Received for PCT Patent Application No. PCT/US2013/031943, dated Sep. 24, 2015, 7 pages.
Office Action received for Chinese Patent Application No. 201380073111.9, dated May 10, 2017, 12 pages of Chinese Office Action Only.
Non-Final Office Action from Chinese Patent Application No. 201380073111.9 dated Jan. 4, 2018, 11 pgs.
Intention to Grant from United Kingdom Application No. 1514056.9 dated May 24, 2018, 2 pgs.
Non-Final Office Action from Chinese Patent Application No. 201380073111.9 notified Jul. 31, 2018, 6 pgs.

* cited by examiner

NANOWIRE TRANSISTOR FABRICATION WITH HARDMASK LAYERS

TECHNICAL FIELD

Embodiments of the present description generally relate to the field of nanowire microelectronic devices, and, more particularly, to a nanowire structure formed using at least one hardmask to prevent degradation of nanowire channels during fabrication.

BACKGROUND

Higher performance, lower cost, increased miniaturization of integrated circuit components, and greater packaging density of integrated circuits are ongoing goals of the microelectronic industry for the fabrication of microelectronic devices. As these goals are achieved, the microelectronic devices scale down, i.e. become smaller, which increases the need for optimal performance from each integrated circuit component.

Maintaining mobility improvement and short channel control as microelectronic device dimensions scale down past the 15 nanometer (nm) node provides a challenge in microelectronic device fabrication. Nanowires may be used to fabricate microelectronic devices which provide improved short channel control. For example, silicon germanium ($Si_xGe_{1-x}$) nanowire channel structures (where x<0.5) provide mobility enhancement at respectable Eg, which is suitable for use in many conventional products which utilize higher voltage operation. Furthermore, silicon germanium ($Si_xGe_{1-x}$) nanowire channels (where x>0.5) provide mobility enhanced at lower Egs (suitable for low voltage products in the mobile/handheld domain, for example).

Many different techniques have been attempted to fabricate and size nanowire-based device. However, improvements may still be needed in the area of fabricating uniform nanowire channels.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DESCRIPTION OF EMBODIMENTS

Figure 1:
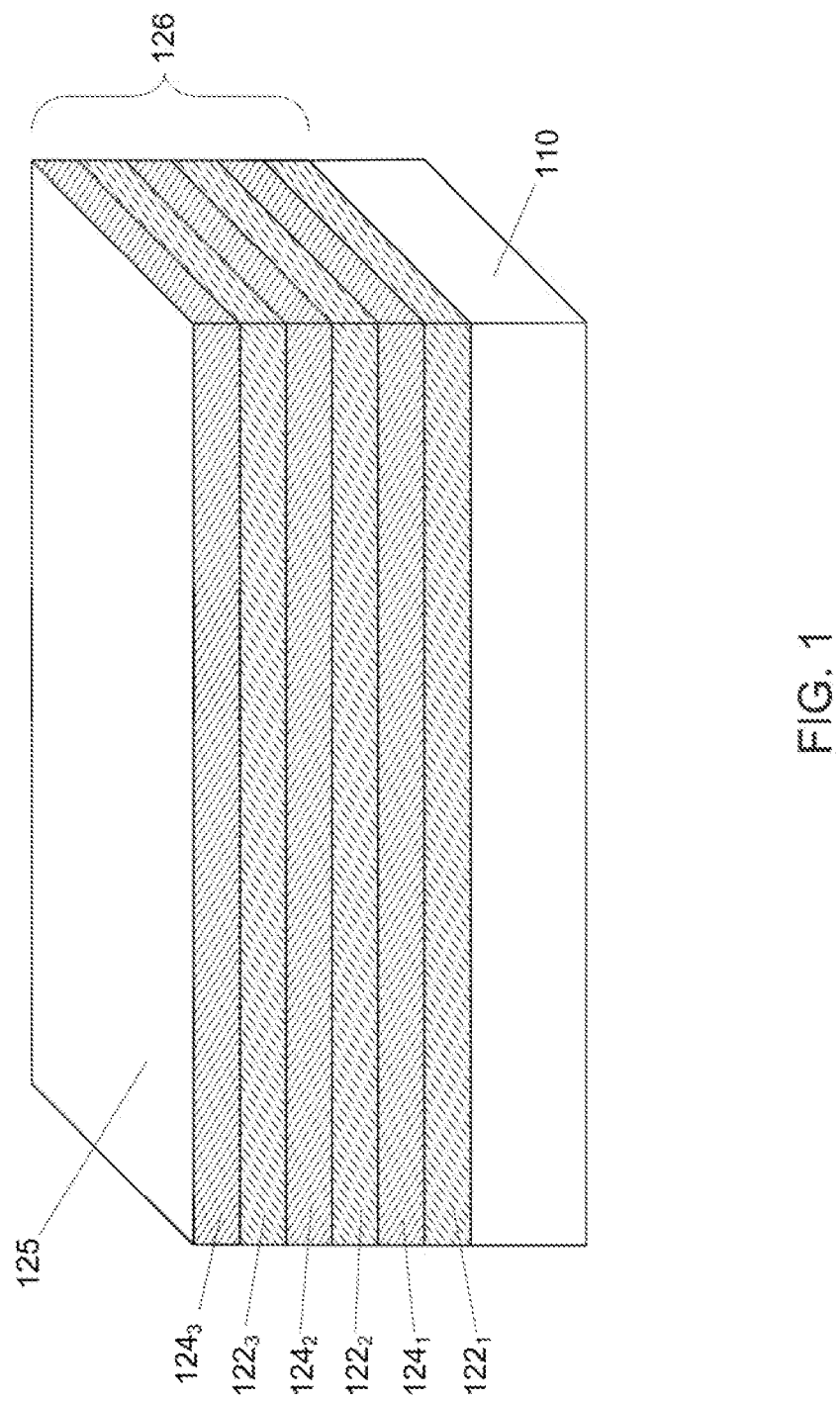
FIGS. 1-14 are oblique and cross-sectional views of a process of forming a nanowire transistor, according to an embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

In the production of nanowire transistors, a replacement gate process may be utilized, which requires removing of a sacrificial gate electrode material formed over a fin structure comprising layers of sacrificial materials and channel gate material layers. The removal of the sacrificial gate electrode may be followed by removal of sacrificial materials from between channel gate material layers to form a plurality of stacked channel nanowires, known as a "nanowire release process". The removal of the sacrificial materials in either the replacement gate process or the nanowire release process may be achieved with etching processes, such as a dry etch, a wet etch, a combination of oxidation and wet etch, and the like. With regard to dry etching, the uppermost channel nanowire may be damaged more by ion bombard than the other channel nanowires (either plasma or plasmaless processes), as exposure to the ion bombardment is greater on the uppermost channel nanowire. With regard to the wet etch and the combination of oxidation and wet etch processes, the uppermost channel nanowire may be damaged more than the other channel nanowires, as the uppermost channel nanowire will have the longest exposure time to the oxidation and/or etching chemicals. Thus, the removal processes may result in an uppermost channel nanowire which is less uniform and less reliable than other channel nanowires in the transistor.

Embodiments of the present description include the incorporation of at least one hardmask during the fabrication of at least one nanowire transistor in order to assist in protecting an uppermost channel nanowire from damage that may result from fabrication processes, such as those used in a replacement metal gate process and/or the nanowire release process. The use of at least one hardmask may result in a substantially damage free uppermost channel nanowire in a multi-stacked nanowire transistor, which may improve the uniformity of the channel nanowires and the reliability of the overall multi-stacked nanowire transistor.

FIGS. 1-14 illustrate methods of forming a nanowire transistor. For the sake of conciseness and clarity, the formation of a single nanowire transistor will be illustrated. As illustrated in FIG. 1, a microelectronic substrate 110 may be provided or formed from any suitable material. In one embodiment, the microelectronic substrate 110 may be a bulk substrate composed of a single crystal of a material which may include, but is not limited to, silicon, germanium, silicon-germanium or a III-V compound semiconductor material. In other embodiments, the microelectronic substrate 110 may comprise a silicon-on-insulator substrate (SOI), wherein an upper insulator layer composed of a material which may include, but is not limited to, silicon dioxide, silicon nitride or silicon oxy-nitride, disposed on the bulk substrate. Alternatively, the microelectronic substrate 110 may be formed directly from a bulk substrate and local oxidation is used to form electrically insulative portions in place of the above described upper insulator layer.

As further shown in FIG. 1, a plurality of sacrificial material layers (illustrated as elements $122_1$, $122_2$, and $122_3$) alternating with a plurality of channel material layers (illustrated as elements $124_1$, $124_2$, and $124_3$) may be formed by any known technique, such as by epitaxial growth, on the microelectronic substrate 110 to form a layered stack 126. In one embodiment, the sacrificial material layers $122_1$, $122_2$, and $122_3$ may be silicon layers and the channel material layers $124_1$, $124_2$, and $124_3$ may be silicon germanium layers. In another embodiment, the sacrificial material layers $122_1$, $122_2$, and $122_3$ may be silicon germanium layers and the channel material layers $124_1$, $124_2$, and $124_3$ may be silicon layer. Although three sacrificial material layers and three channel material layers are shown, it is understood that any appropriate number of sacrificial material layers and channel material layers may be used.

Figure 2:
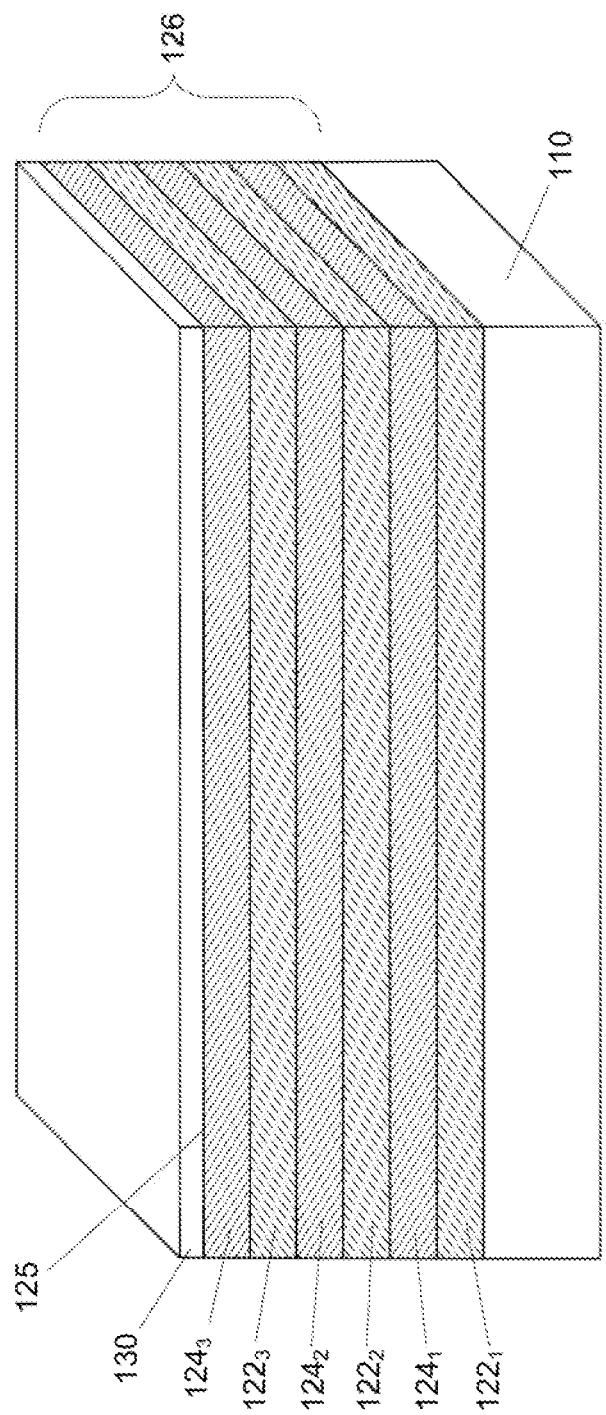

As shown in FIG. 2, a hardmask layer 130 may be formed on a top surface 125 of the uppermost channel material layer $124_3$. The uppermost channel material layer $124_3$ may be defined to be the channel material layer farthest from the microelectronic substrate 110. The hardmask layer 130 may be any appropriate hardmask material, including but not limited to silicon, porous silicon, amorphous silicon, silicon nitride, silicon oxynitride, silicon oxide, silicon dioxide, silicon carbonitride, silicon carbide, aluminum oxide, hafnium oxide, zirconium oxide, tantalum silicate, lanthanum oxide, polymer materials, and the like. The hardmask layer 130 may be formed by any technique known in the art, including but not limited to, physical vapor deposition (PVD), atomic layer deposition (ALD) and various implementations of chemical vapor deposition (CVD), such as atmospheric pressure CVD (APCVD), low pressure CVD (LPCVD), and plasma enhanced CVD (PECVD).

Figure 3:
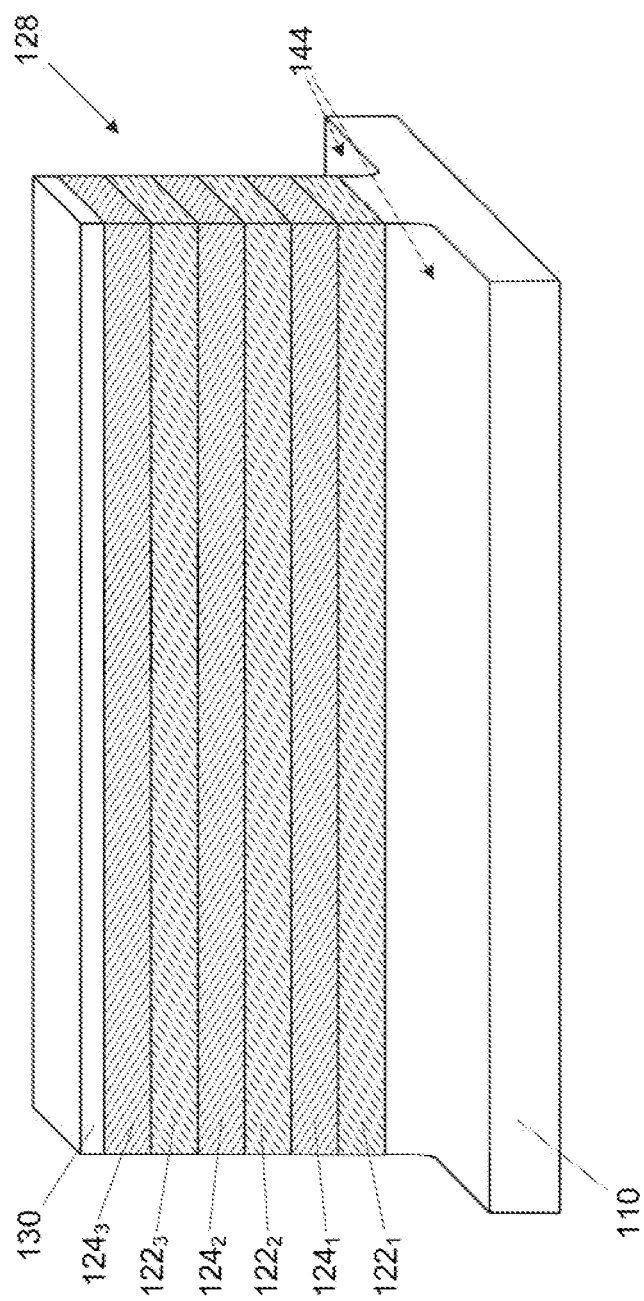

The layered stack 126 (see FIG. 2) and the hardmask layer 130 may be patterned using conventional patterning/etching techniques to form at least one fin structure 128, as shown in FIG. 3. For example, the layered stack 126 (see FIG. 2) and the hardmask layer 130 may be etched during a trench etch process, such as during a shallow trench isolation (STI) process, wherein trenches 144 may be formed in the microelectronic substrate 110 in the formation of the fin structure 128, and wherein the trenches 144 may be formed on opposing sides of the fin structures 128. As will be understood by those skilled in the art, a plurality of substantially parallel of fin structures 128 are generally formed simultaneously.

Figure 4:
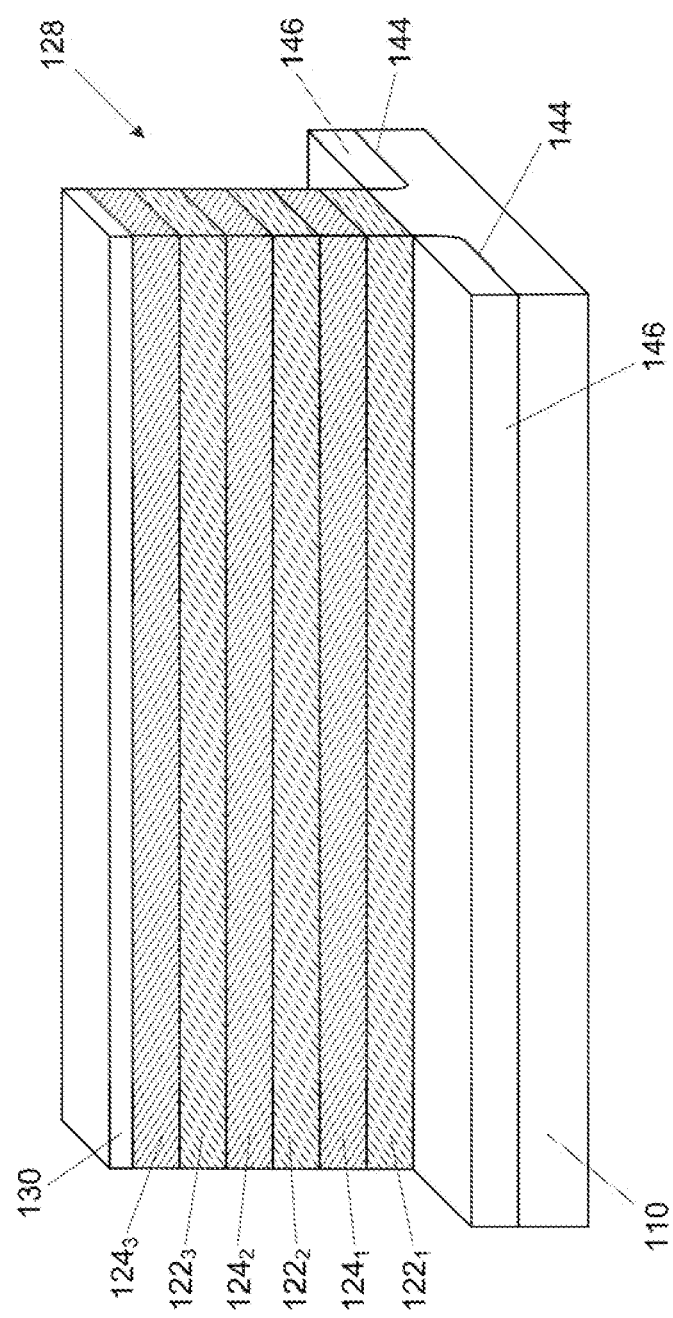

As shown in FIG. 4, dielectric material structures 146, such as silicon dioxide, may be formed or deposited within the trenches 144 proximate the microelectronic substrate 110 to electrically separate the fin structures 128. As will be understood to those skilled in the art, the process of forming the dielectric material structures 146 may involve a variety of process including, but not limited to, depositing dielectric material, polishing/planarizing the dielectric material, and etching back the dielectric material.

Figure 5:
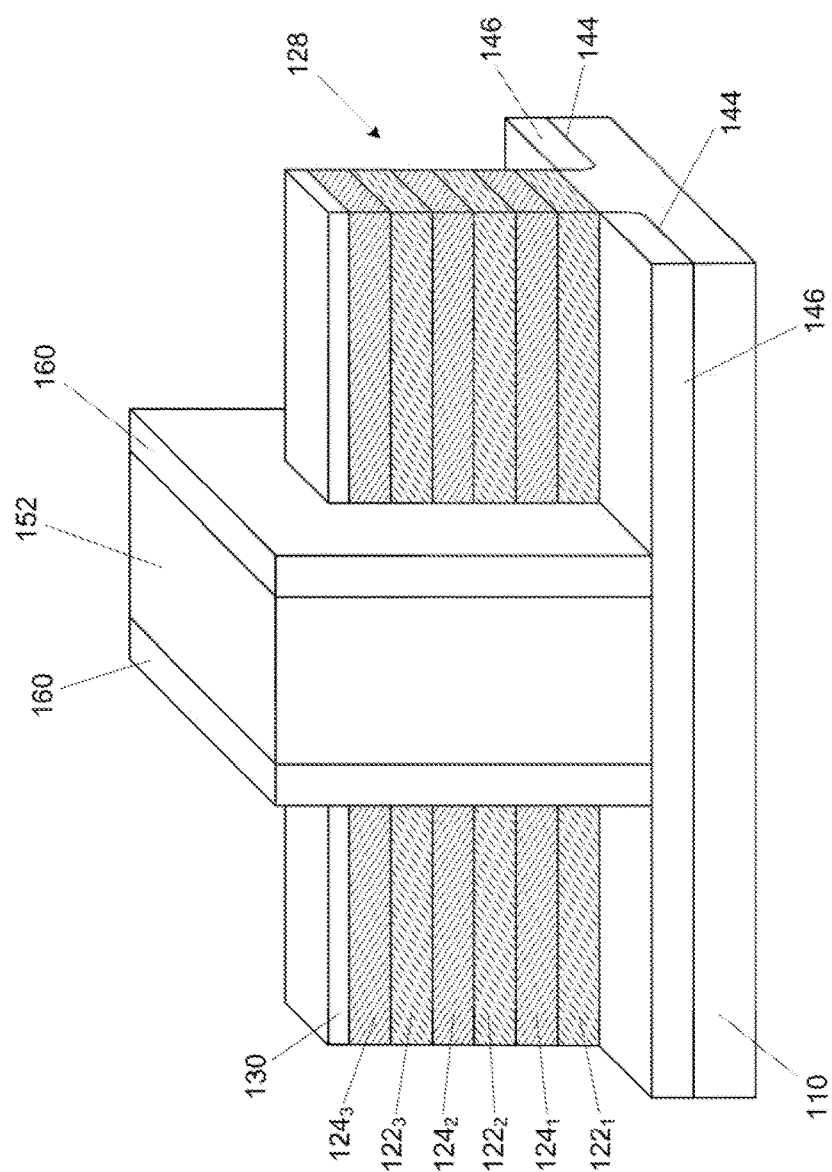
Figure 6:
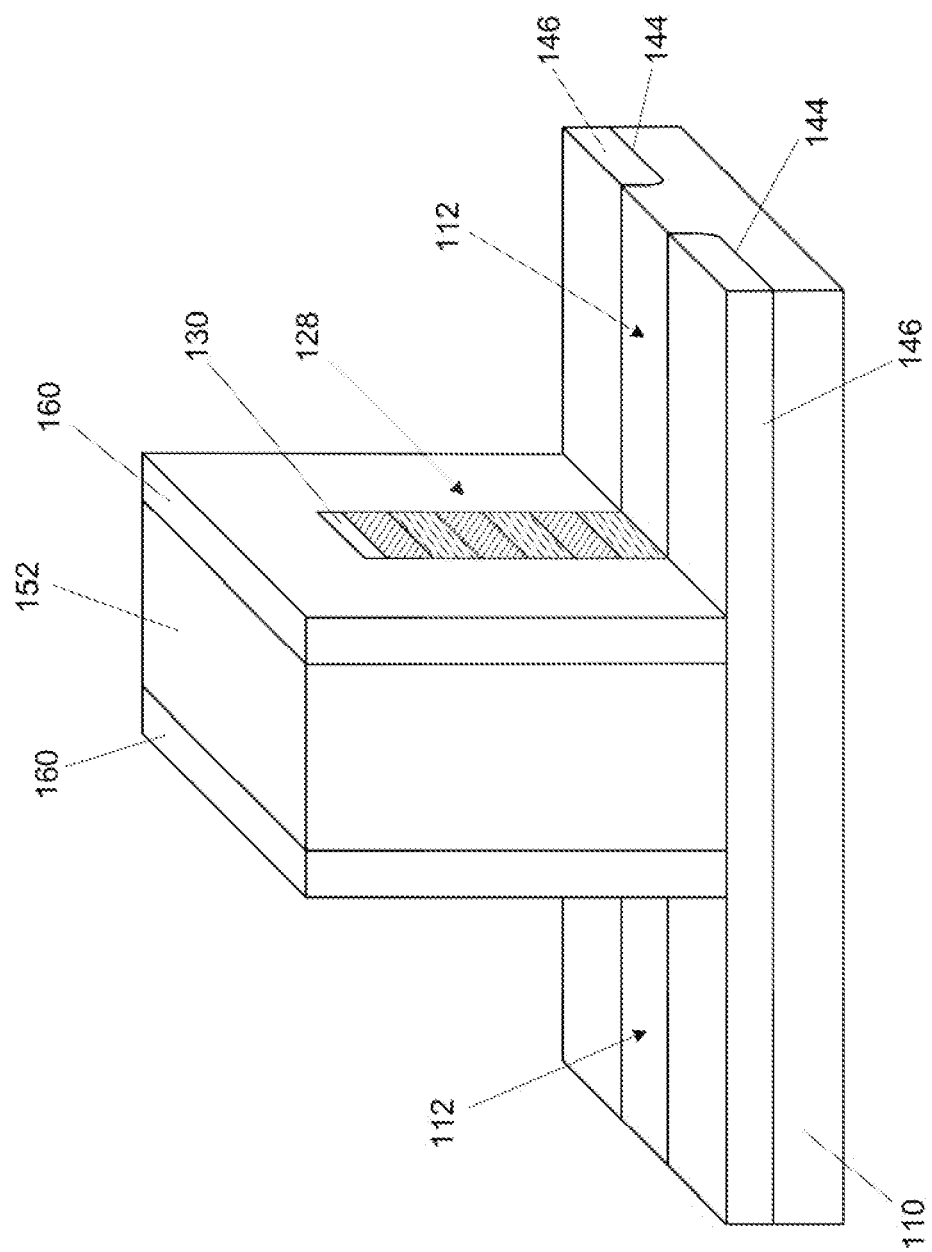

As shown in FIG. 5, spacers 160 may be formed on and across the fin structure 128 and the hardmask layer 130, and may be disposed substantially orthogonally with respect to the fin structure 128. In an embodiment, the spacers 160 may comprise any material that may be selective during subsequent processing to the fin structure 128 materials and the hardmask layer 130, as will be discussed. As further shown in FIG. 5, a sacrificial gate electrode material 152 may be formed within/between the spacers 160, and may be formed around portions of the fin structures 128 located between the spacers 160. In an embodiment, the sacrificial gate electrode material 152 may be formed around portions of the fin structure 128 and the hardmask layer 130, and the spacers 160 may be on either side of the sacrificial gate electrode material 152. The sacrificial gate electrode material 152 may comprise any appropriate sacrificial material, including, but not limited to polysilicon. As shown in FIG. 6, a portion of each fin structure 128 and the hardmask layer 130 (external to the sacrificial gate electrode material 152 and the spacers 160) may be removed to expose portions 112 of the microelectronic substrate 110. The portions of each fin structure 128 and the hardmask layer 130 may be removed by any process known in the art, including, but not limited to, a dry etching process.

Figure 7:
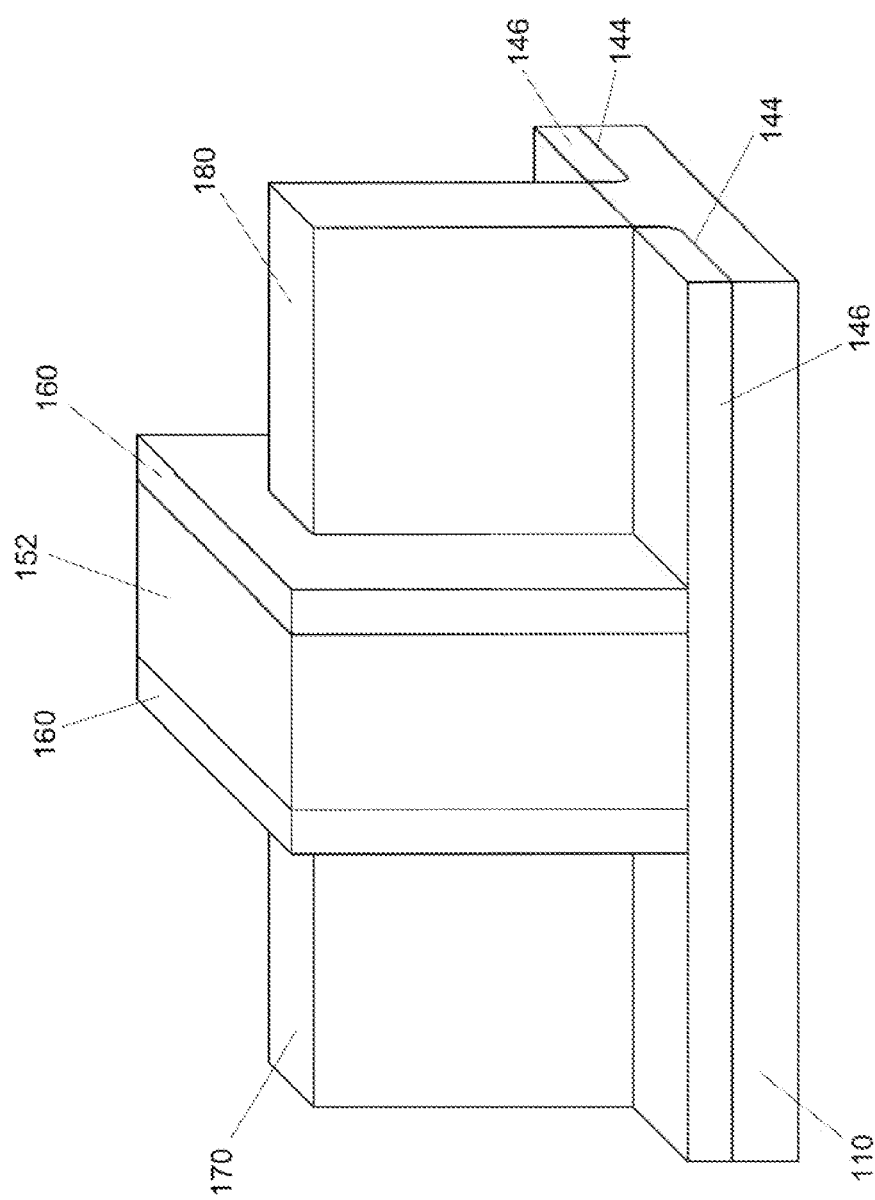

As shown in FIG. 7, a source structure 170 and a drain structure 180 may be formed on the microelectronic substrate portions 112 (see FIG. 6) on opposing ends of the fin structure 128, such as by an epitaxial growth of silicon or silicon germanium, and may be coupled to the portions of the fin structures 128 disposed between the spacers 160. In an embodiment, the source structures 170 or the drain structures 180 may be n-doped silicon for an NMOS device, or may be p-doped silicon/silicon germanium for a PMOS device, depending on the device type for the particular application. Doping may be introduced in the epitaxial process, by implant, by plasma doping, by solid source doping or by other methods as are known in the art.

Figure 8:
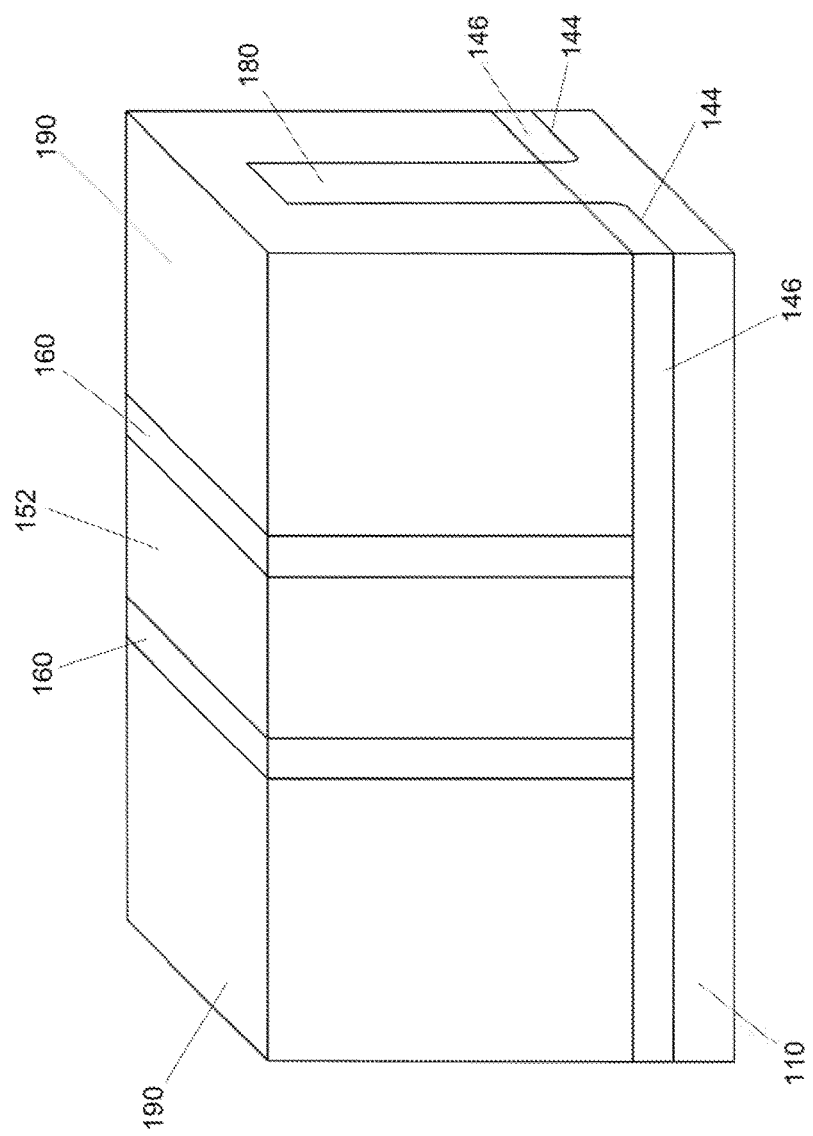
Figure 9:
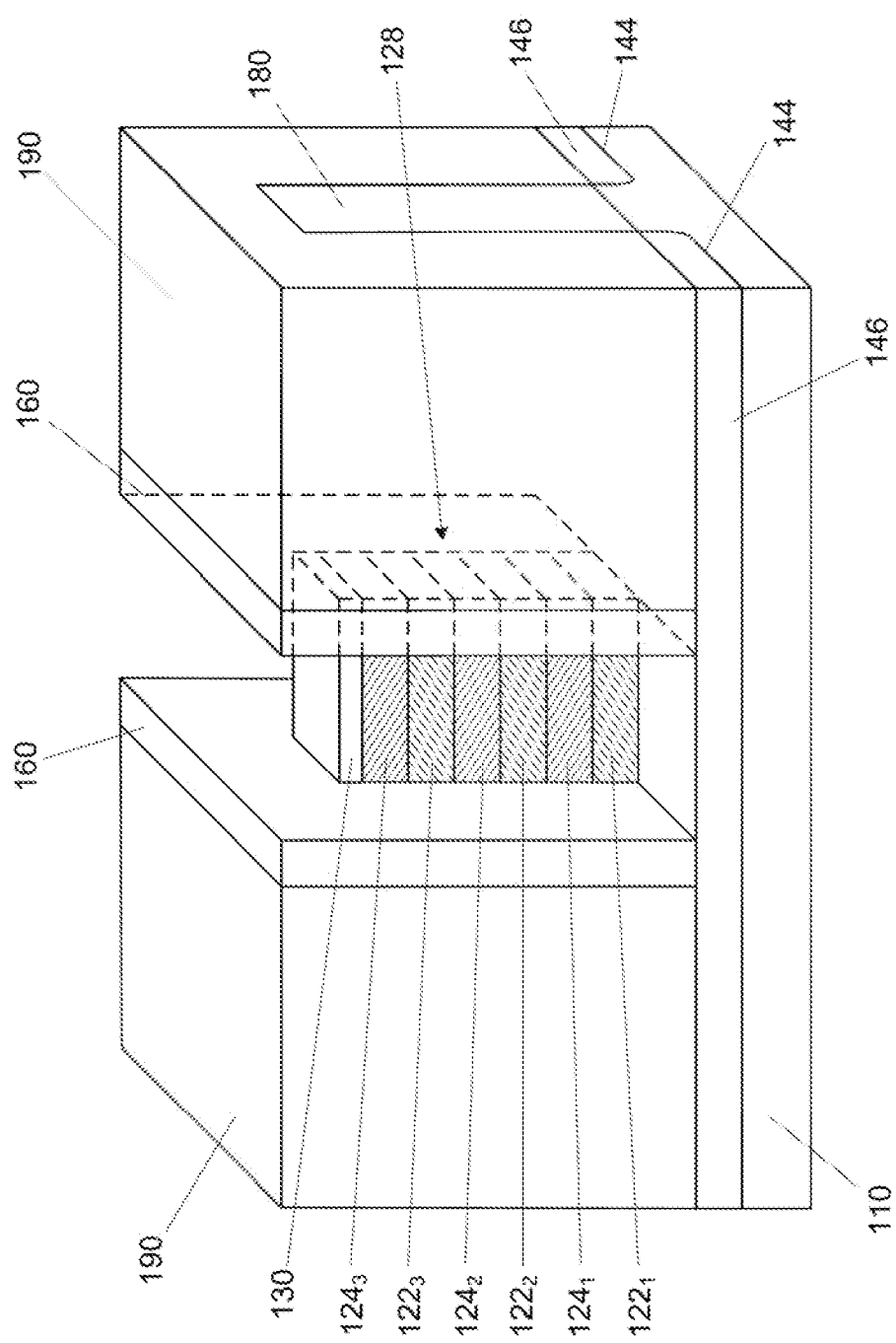

As shown in FIG. 8, an interlayer dielectric layer 190 may be formed on the microelectronic substrate 110 over the source structures 170, the drain structures 180, the sacrificial gate electrode material 152, and the spacers 160, wherein the interlayer dielectric layer 190 may be planarized, such as by chemical mechanical polishing, to expose the sacrificial gate electrode material 152. As shown in FIG. 9, the sacrificial gate electrode material 152 may then be removed from between the spacer materials 160, such as by an etching process, including but not limited to a wet etch, a combination of wet etching and oxidation, or a dry etch (plasma or plasmaless).

Figure 10:
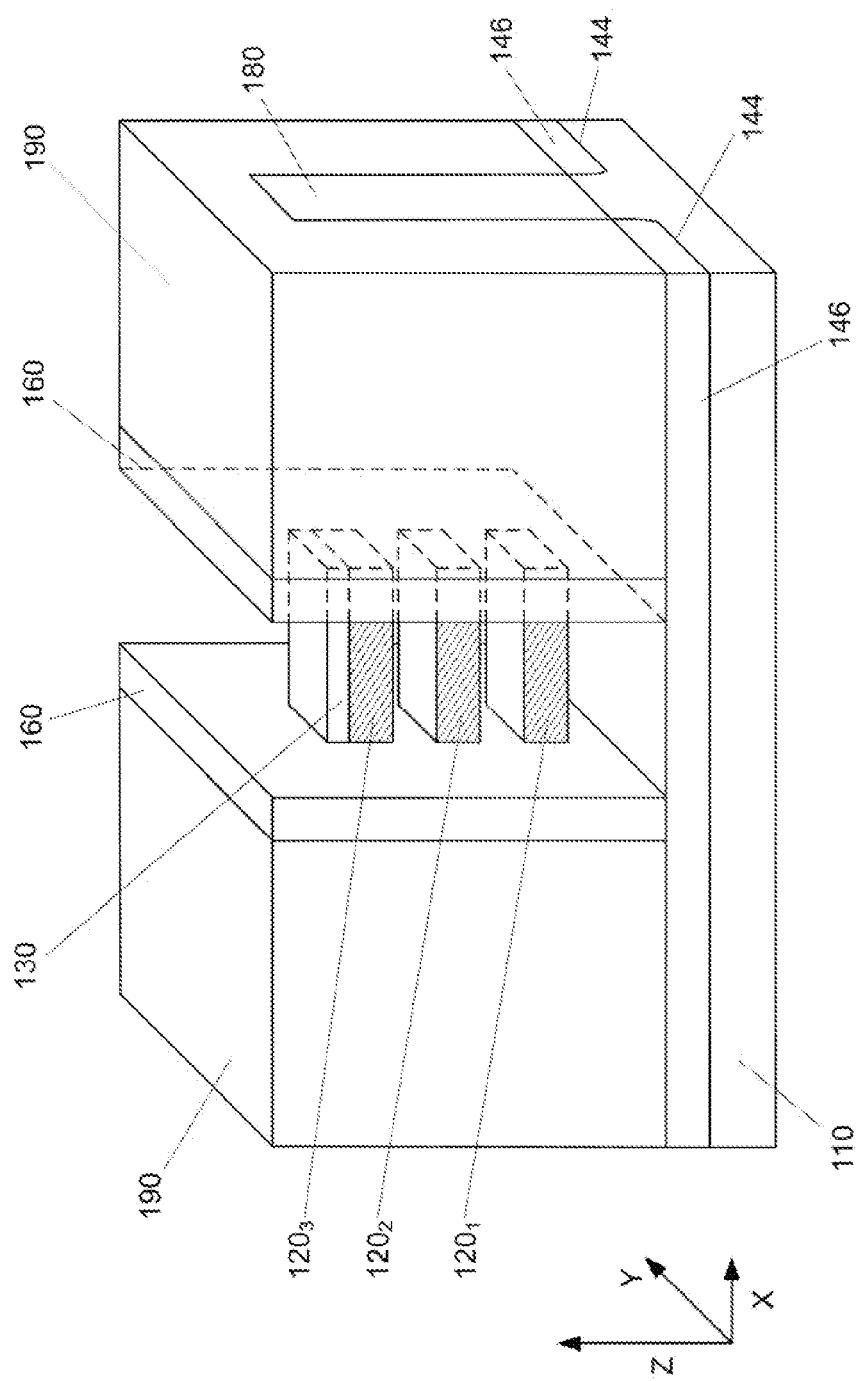

As shown in FIG. 10, the sacrificial material layers $122_1$, $122_2$, and $122_3$ (see FIG. 9) may be selectively removed from the fin structure 128 (see FIG. 9) between the channel material layers $124_1$, $124_2$, and $124_3$ (see FIG. 9) to form channel nanowires (illustrated as elements $120_1$, $120_2$, and $120_3$, and may be referred to herein collectively as "channel nanowires $120_n$") extending between the source structure 170 (see FIG. 7) and the drain structure 180, wherein the channel nanowires $120_n$ may be aligned vertically (e.g.

z-direction) and spaced apart from one another. In an embodiment, the sacrificial material layers $122_1$, $122_2$, and $122_3$ may be etched with a wet etch, a combination of wet etching and oxidation, or a dry etch (plasma or plasmaless) that selectively removes the sacrificial material layers $122_1$, $122_2$, and $122_3$ while not etching the channel material layers $124_1$, $124_2$, and $124_3$. In one embodiment, wherein the sacrificial material layers $122_1$, $122_2$, and $122_3$ are silicon and the channel material layers $124_1$, $124_2$, and $124_3$ are silicon germanium, the wet etch may include, but is not limited to, aqueous hydroxide chemistries, including ammonium hydroxide and potassium hydroxide. In another embodiment, wherein the sacrificial material layers $122_1$, $122_2$, and $122_3$ are silicon germanium and the channel material layers $124_1$, $124_2$, and $124_3$ are silicon, the wet etch may include, but is not limited to solutions of carboxylic acid/nitric acid/hydrofluoric acid, and solutions of citric acid/nitric acid/hydrofluoric acid. It is understood that the hardmask layer 130 may protect the uppermost channel material layer $124_3$ during this process.

In an embodiment, both silicon and silicon germanium channel nanowires $120_n$ may exist on the same wafer, in the same die, or on the same circuit, for example as NMOS Si and PMOS SiGe in an inverter structure. In an embodiment with NMOS Si and PMOS SiGe in the same circuit, the Si channel thickness (SiGe interlayer) and SiGe channel thickness (Si interlayer) may be mutually chosen to enhance circuit performance and/or circuit minimum operating voltage. In an embodiment, the number of nanowires on different devices in the same circuit may be changed through an etch process to enhance circuit performance and/or circuit minimum operating voltage.

Figure 11:
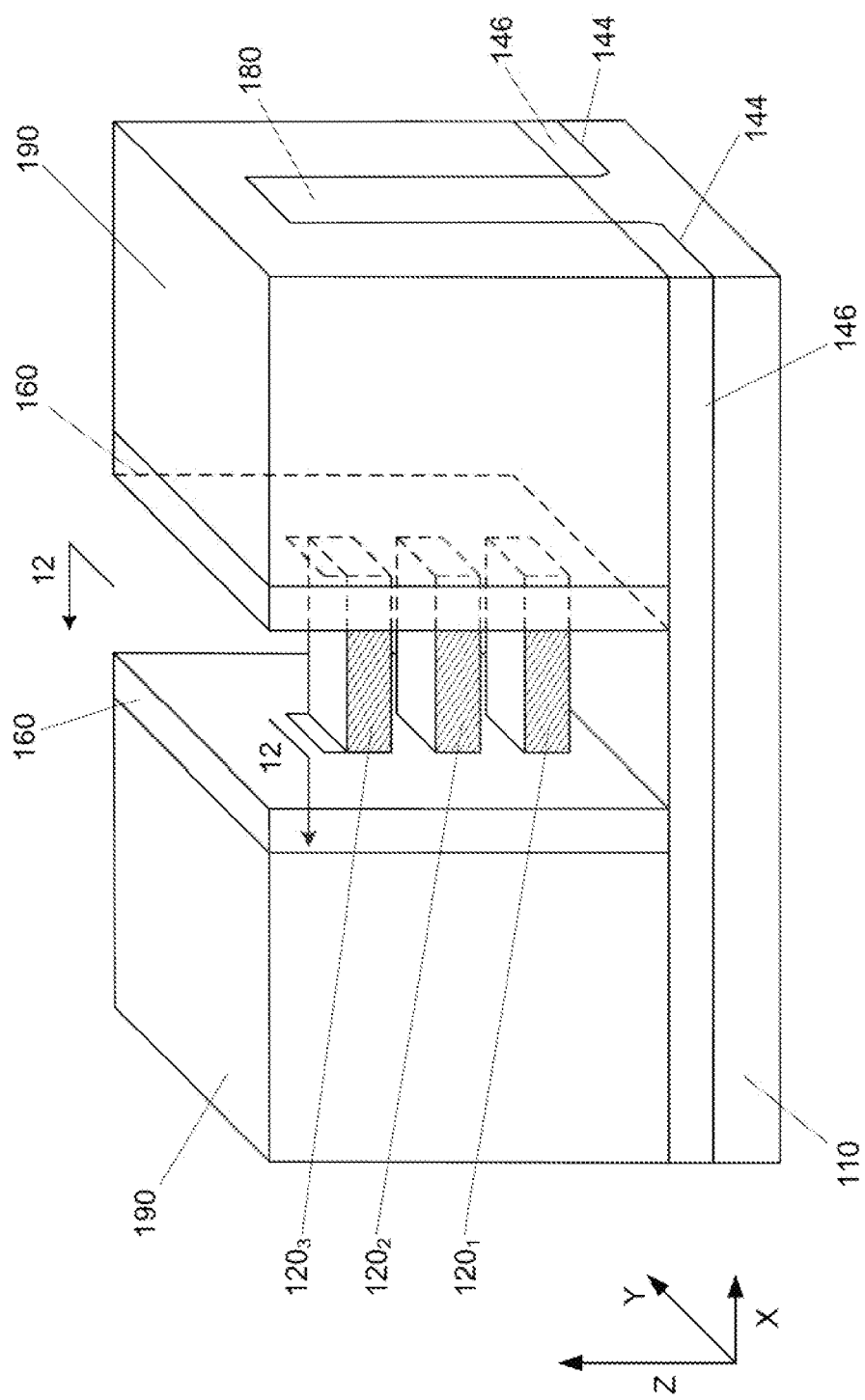

As shown in FIG. 11, the hardmask layer 130 may be removed from between the spacers 160. In one example, wherein the hardmask layer 130 comprises silicon nitride, a solution of phosphoric acid may be used for the removal of the hardmask layer 130. It is also understood that the hardmask layer 130 may be removed during the removal of the sacrificial material layers $122_1$, $122_2$, and $122_3$, but may remain sufficiently long enough to protect the uppermost channel material layer $124_3$ during the majority of the process.

Figure 12:
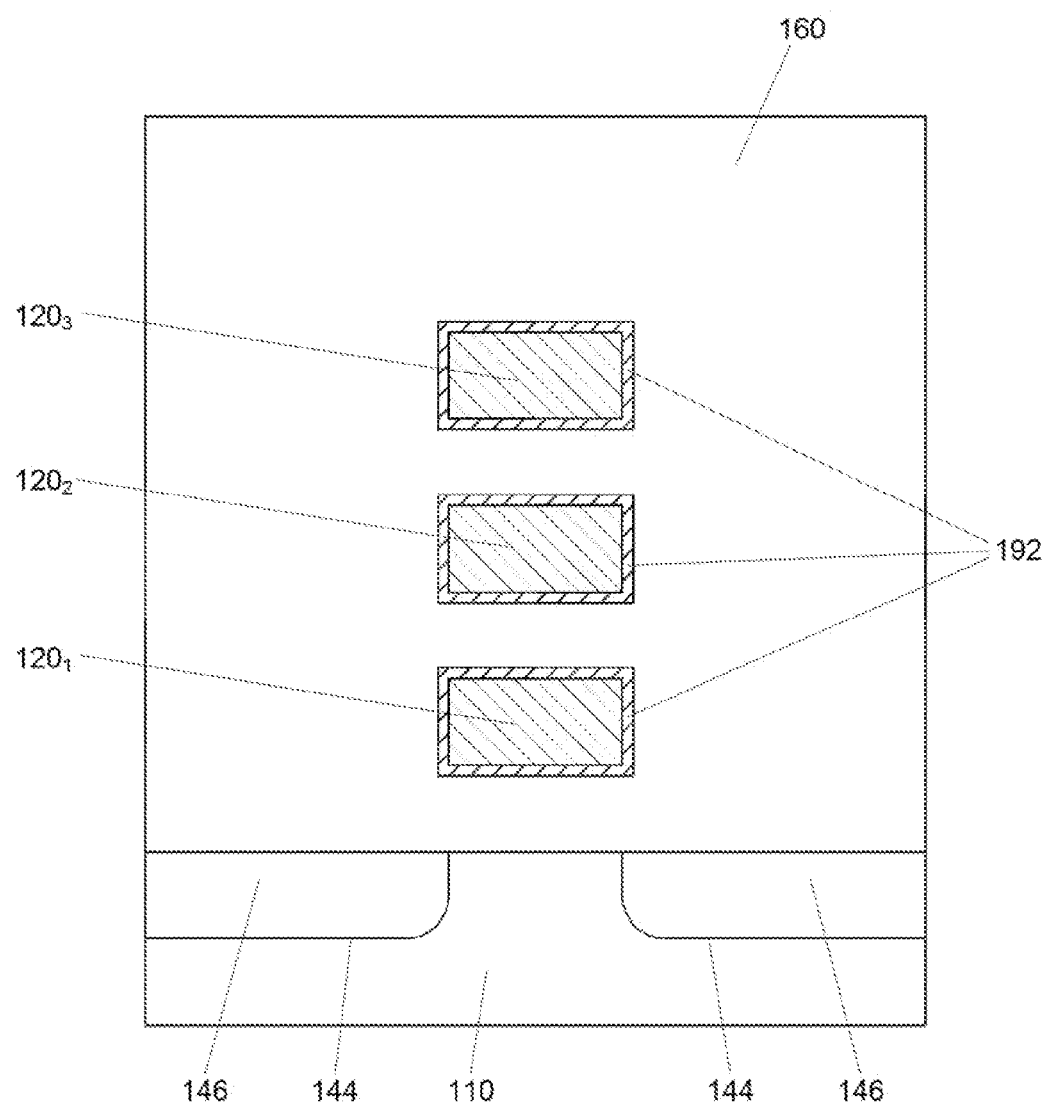

As shown in FIG. 12 (cross-section along line 12-12 of FIG. 11), a gate dielectric material 192 may be formed to surround the channel nanowires $120_1$, $120_2$, and $120_3$ between the spacers 160. In an embodiment, the gate dielectric material 192 may comprise a high k gate dielectric material, wherein the dielectric constant may comprise a value greater than about 4. Example of high k gate dielectric materials may include but are not limited to hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate. In one embodiment, the gate dielectric material 192 may be formed substantially conformally around the channel nanowires $120_1$, $120_2$, and $120_3$, and may form a substantially conformal layer on the spacers 160. The gate dielectric material 192 may be deposited using any method well-known in the art to yield a conformal layer, such as, but not limited to, atomic layer deposition (ALD) and various implementations of chemical vapor deposition (CVD), such as atmospheric pressure CVD (APCVD), low pressure CVD (LPCVD), and plasma enhanced CVD (PECVD).

Figure 13:
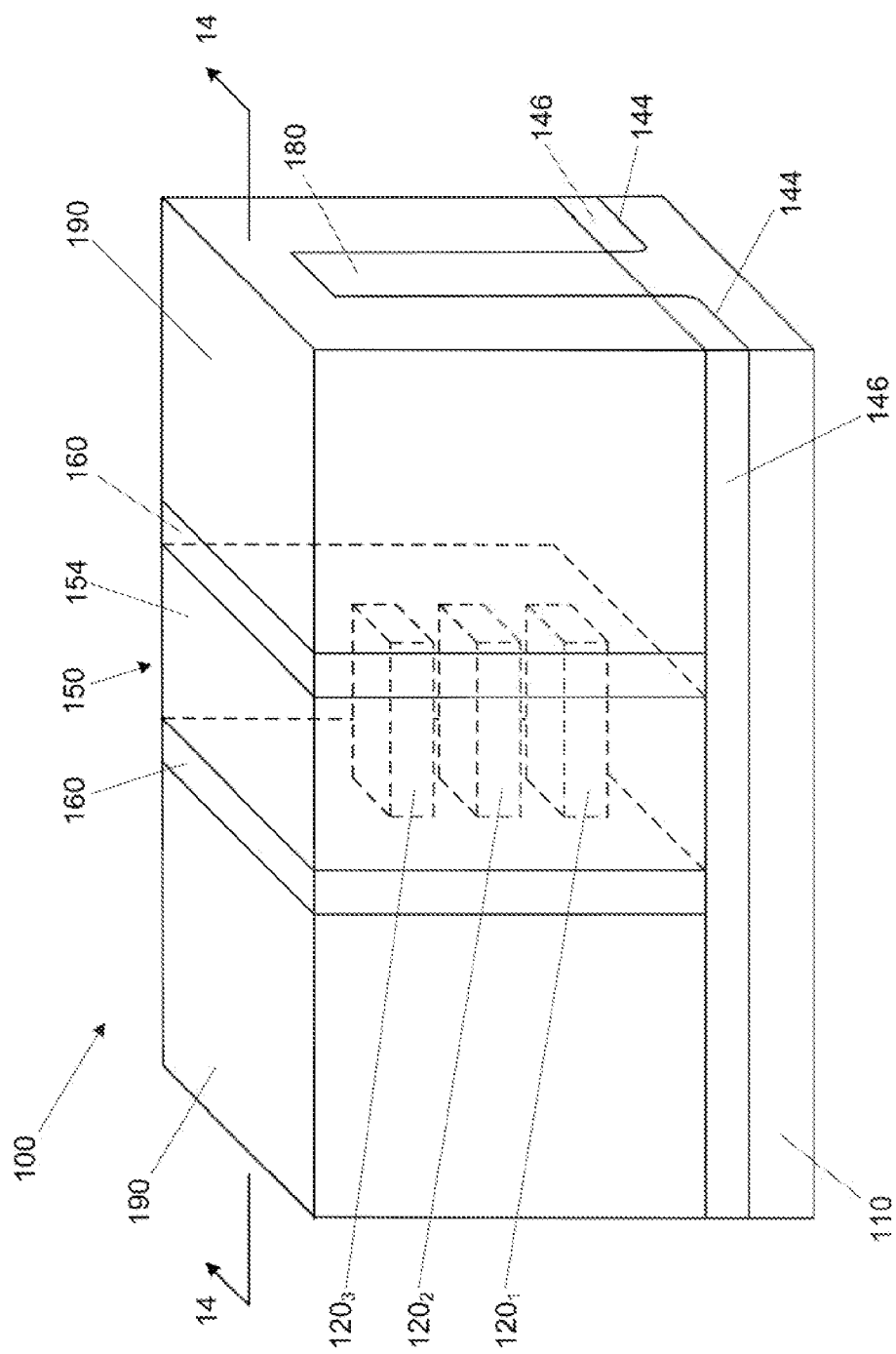
Figure 14:
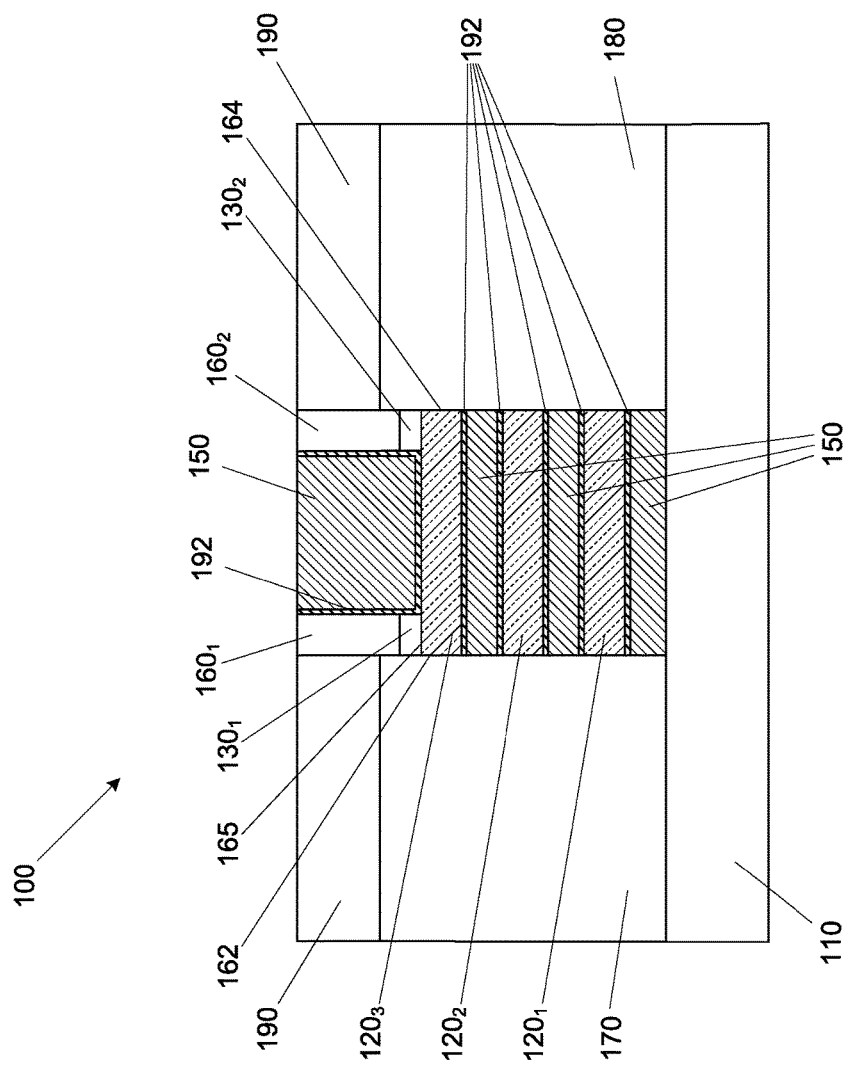

As shown in FIGS. 13 and 14, a gate electrode material 154 may then be formed around the channel nanowires $120_1$, $120_2$, and $120_3$ to form a gate electrode 150 and thereby forming a multi-stacked nanowire transistor 100. The gate electrode material 154 may comprise any appropriate conductive material, including, but not limited to, pure metal and alloys of titanium, tungsten, tantalum, aluminum, copper, ruthenium, cobalt, chromium, iron, palladium, molybdenum, manganese, vanadium, gold, silver, and niobium. Less conductive metal carbides, such as titanium carbide, zirconium carbide, tantalum carbide, tungsten carbide, and tungsten carbide, may also be used. The gate electrode material may also be made from a metal nitride, such as titanium nitride and tantalum nitride, or a conductive metal oxide, such as ruthenium oxide. The gate electrode material may also include alloys with rare earths, such as terbium and dysprosium, or noble metals such as platinum.

As shown in FIG. 14, the nanowire transistor 100 may include the spacers 160 (illustrated as a first spacer $160_1$ and a second spacer $160_2$) positioned proximate opposing ends, first end 162 and second end 164, respectively, of an uppermost channel nanowire $120_3$ and each abutting a top surface 165 of the uppermost channel nanowire $120_3$ (i.e., the uppermost channel material layer top surface 125 becomes the uppermost channel nanowire top surface 165 on the fabrication of the channel nanowires $120_n$). A first portion $130_1$ of the hardmask layer 130 may reside between the first spacer $160_1$ and the uppermost channel material layer top surface 125, and a second portion $130_2$ of the hardmask layer 130 may reside between the second spacer $160_2$ and the uppermost channel material layer top surface 125. The gate dielectric material 192 may abut the uppermost channel nanowire top surface 165 between the hardmask layer first portion $130_1$ and the hardmask layer second portion $130_2$. Further, the gate electrode 150 may abut the gate dielectric material 192.

It is understood that further processing, not shown, may be conducted, such as forming trench contacts to the source structure 170 and the drain structure 180, and the like.

Figure 15:
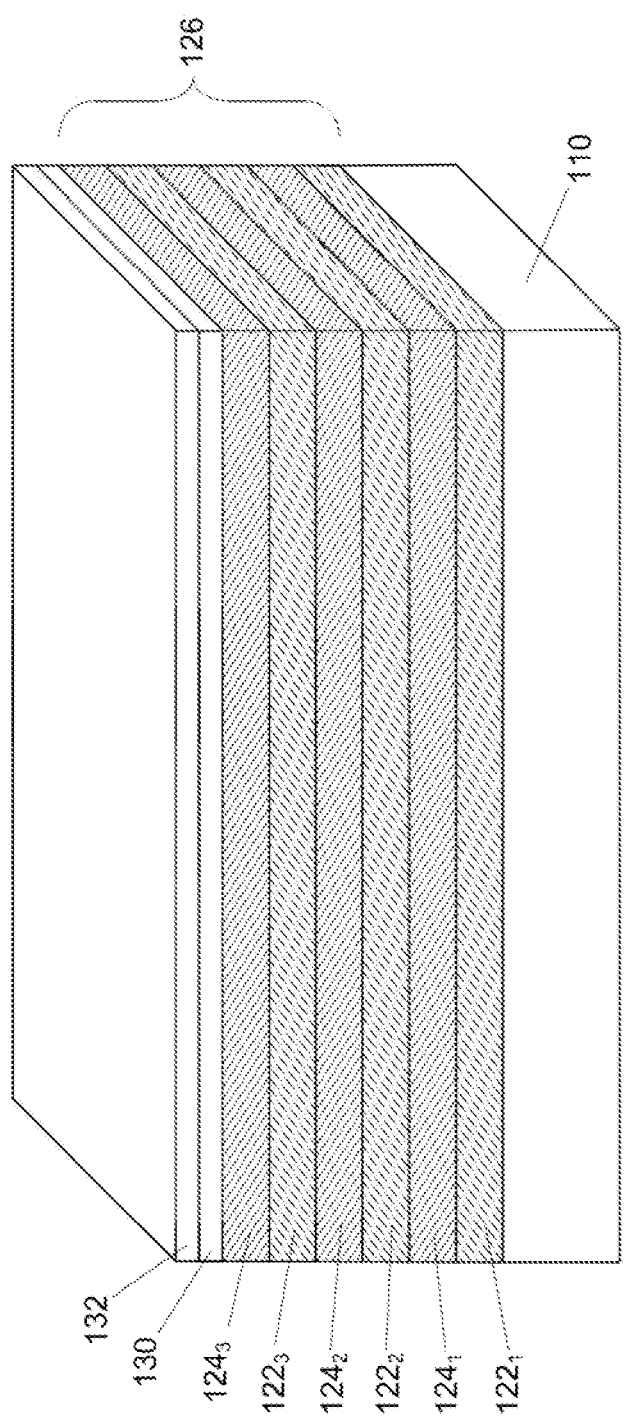
FIGS. 15 and 16 are oblique views of a process of forming a nanowire transistor, according to another embodiment of the present description.

It is understood that plurality of hardmasks may be used. For example, beginning with the layered stack 126 (see FIG. 2) with the hardmask layer 130 formed thereon, at least one additional hardmask layer 132 may be formed on the hardmask layer 130. The layered stack 126 (see FIG. 2), the hardmask layer 130, and the at least one additional hardmask 132 may be patterned using conventional patterning/etching techniques to form at least one fin structure 128, as shown in FIG. 15. For example, the layered stack 126 (see FIG. 2), the hardmask layer 130, and the at least one additional hardmask layer 132 may be etched during a trench etch process, such as during a shallow trench isolation (STI) process, wherein trenches 144 may be formed into the microelectronic substrate 110 in the formation of the fin structure 128.

Figure 16:
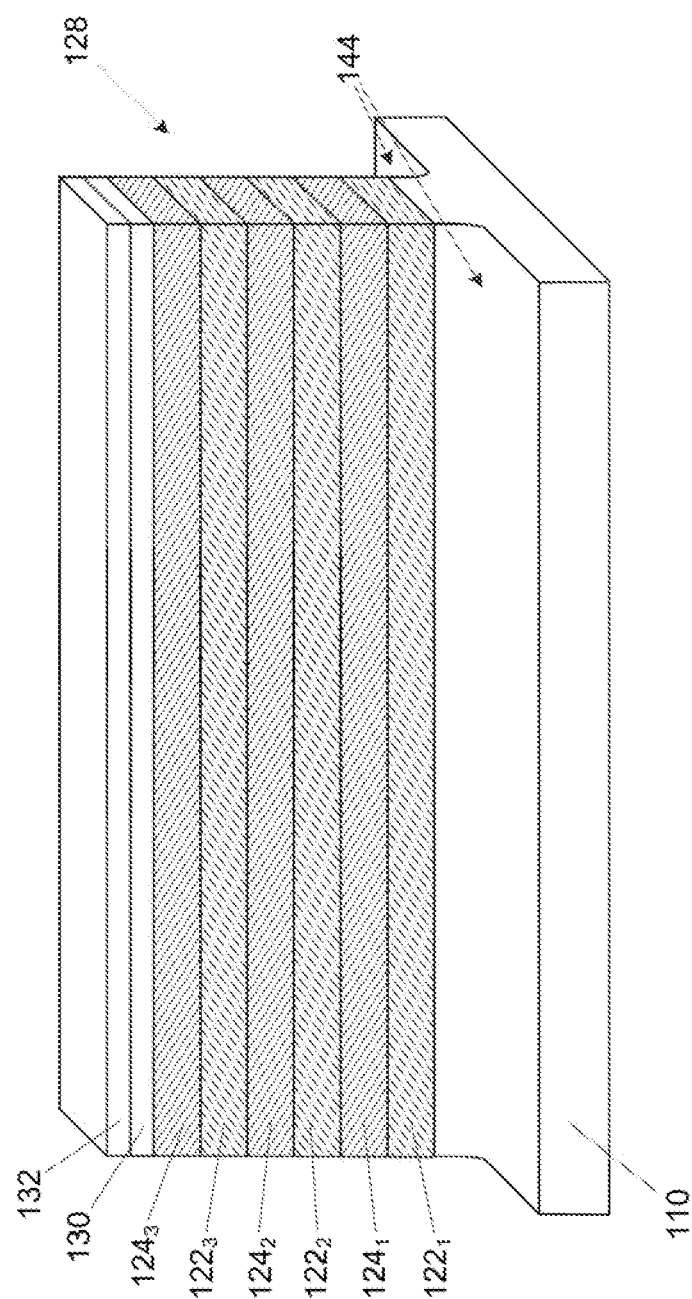
Figure 17:
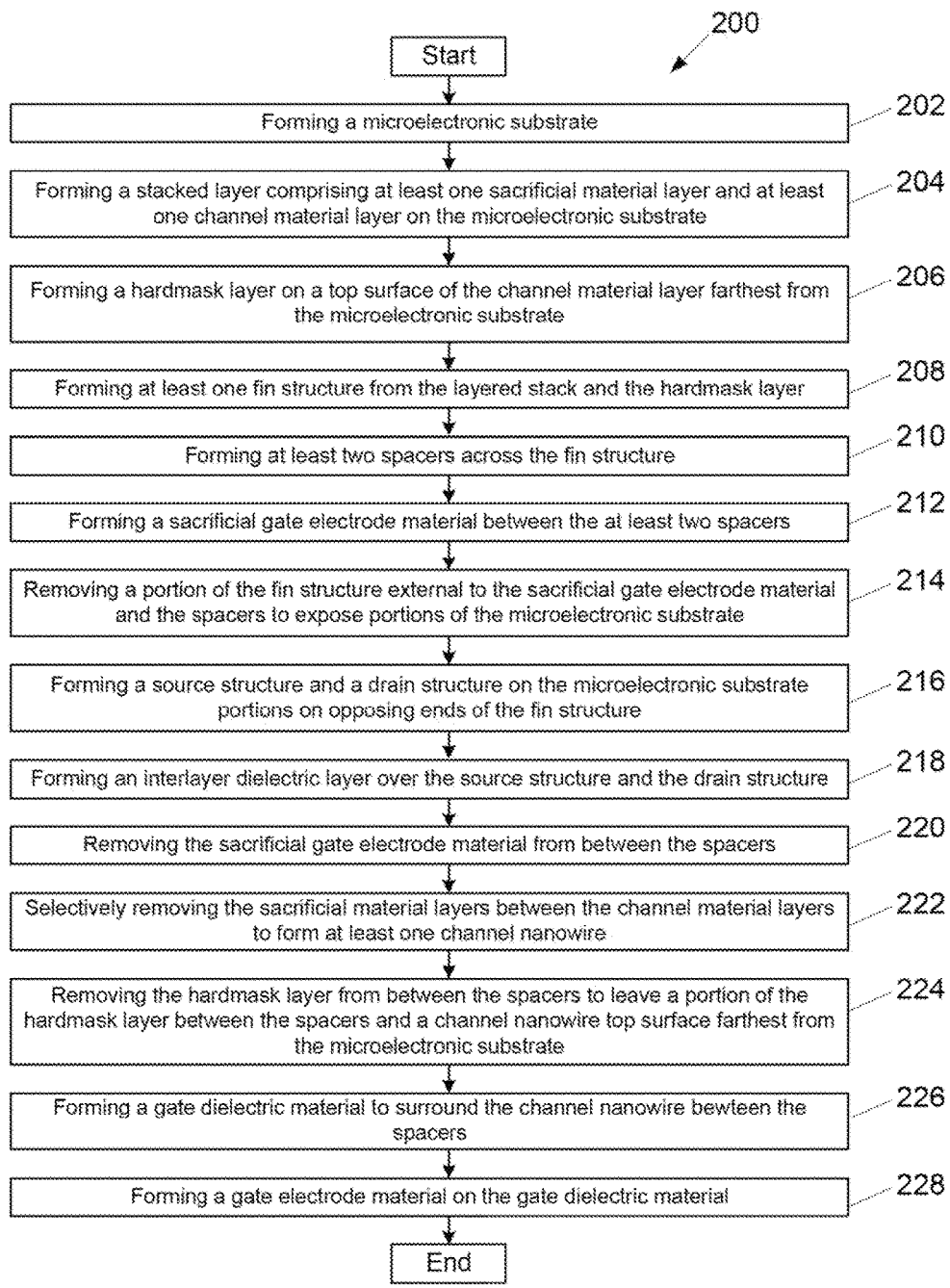
FIG. 17 is a flow chart of a process of fabricating a microelectronic device, according to an embodiment of the present description.

As shown in FIG. 16, dielectric material structures 146, such as silicon dioxide, may be formed or deposited within the trenches 144 proximate the microelectronic substrate 110 to electrically separate the fin structures 128. As previously discussed, the process of forming the dielectric material structures 146 may involve a variety of process including, but not limited to, depositing dielectric material, polishing/planarizing the dielectric material, and etching back to the dielectric material to form the dielectric material structures 146. As shown in FIG. 17, the at least one additional hardmark layer 132 of FIG. 16 may be eroded, ablated, or removed during these processes, or may be removed by a separate process thereafter. The processing then continues at FIG. 5, as discussed above. It is understood that when more than one hardmask layer is utilized, the at least one additional hardmask layer 132 may be selected to specifically resist the process with regard to the formation of the dielectric material structures 146 and the hardmask layer 130 may be selected to specifically resist the process with regard to the removal of the sacrificial material layers $122_1$, $122_2$, and $122_3$.

FIG. 17 is a flow chart of a process 200 of fabricating a nanowire transistor structure according to an embodiment of the present description. As set forth in block 202, a microelectronic substrate may be formed. A stacked layer comprising at least one sacrificial material layer and at least one channel material layer may be formed on the microelectronic substrate, as set forth in block 204. As set forth in block 206, a hardmask layer may be formed on a top surface of the channel material layer farthest from the microelectronic substrate. At least one fin structure may be formed from the layered stack and the hardmask layer, as set forth in block 208. As set forth in block 210, at least two spacers may be formed across the fin structure. A sacrificial gate electrode material may be formed between the at least two spacers, as set forth in block 212. As set forth in block 214, a portion of the fin structure external to the sacrificial gate electrode material and the spacers may be removed to expose portions of the microelectronic substrate. A source structure and a drain structure may be formed on the microelectronic substrate portions on opposing ends of the fin structure, as set forth in block 216. As set forth in block 218, an interlayer dielectric layer may be formed over the source structure and the drain structure. The sacrificial gate electrode material may be removed from between the spacers, as set forth in block 220. As set forth in block 222, the sacrificial material layers may be selectively removed from between the channel material layer to form at least one channel nanowire. The hardmask layer may be removed from between the spacers to leave a portion of the hardmask layer between the spacers and a channel nanowire top surface farthest from the microelectronic substrate, as set forth in block 224. As set forth in block 226, a gate dielectric material may be formed to surround the channel nanowire between the spacers. A gate electrode material may be formed on the gate dielectric material, as set forth in block 228.

Figure 18:
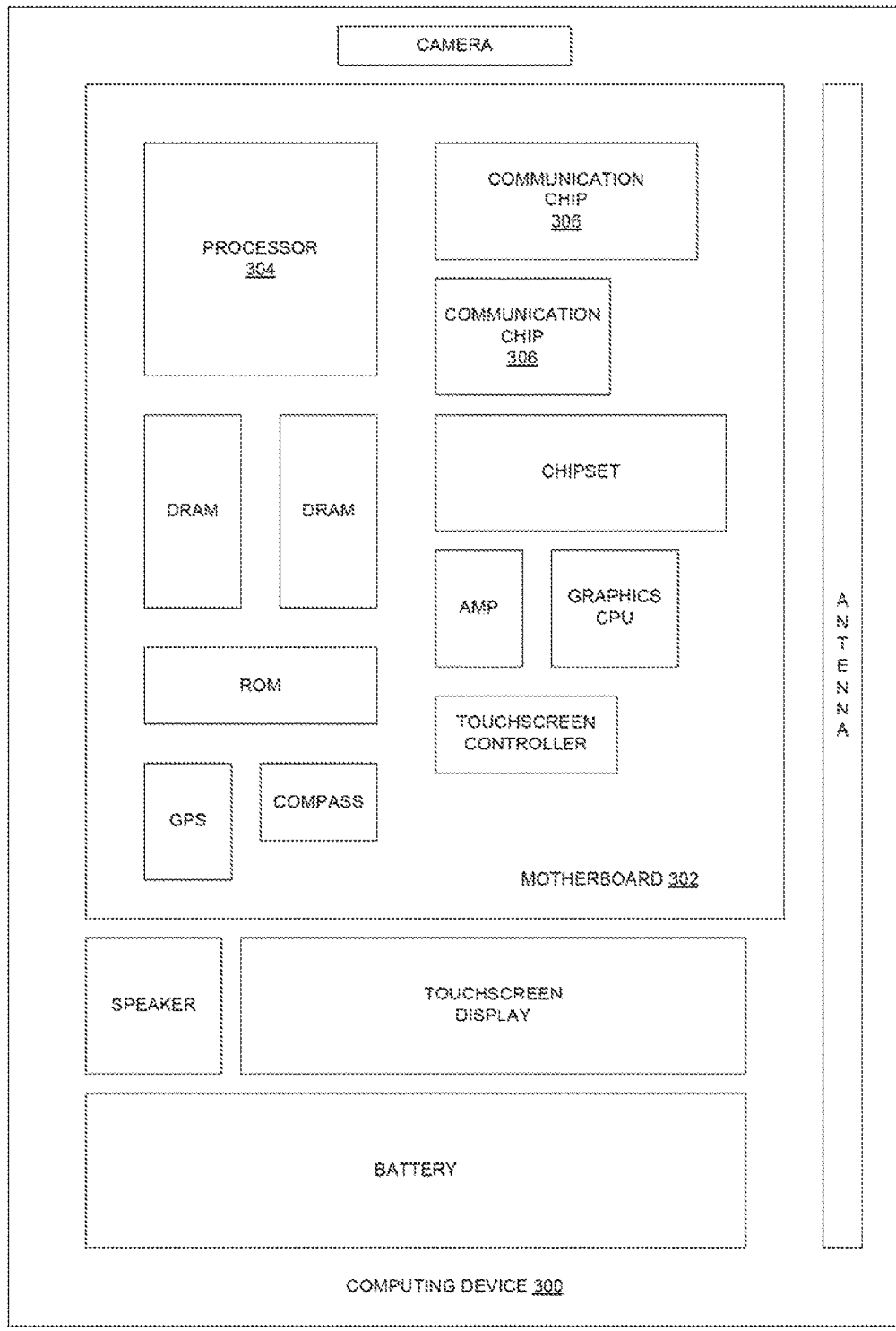
FIG. 18 illustrates a computing device in accordance with one implementation of the present description.

FIG. 18 illustrates a computing device 300 in accordance with one implementation of the present description. The computing device 300 houses a board 302. The board 302 may include a number of components, including but not limited to a processor 304 and at least one communication chip 306. The processor 304 is physically and electrically coupled to the board 302. In some implementations the at least one communication chip 306 is also physically and electrically coupled to the board 302. In further implementations, the communication chip 306 is part of the processor 304.

Depending on its applications, the computing device 300 may include other components that may or may not be physically and electrically coupled to the board 302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 306 enables wireless communications for the transfer of data to and from the computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 300 may include a plurality of communication chips 306. For instance, a first communication chip 306 may be dedicated to shorter range wireless communications such as Wi-Fi and Bluetooth and a second communication chip 306 may be dedicated to longer range wireless communications such as GPS, EDGE, GPRS, CDMA, WiMAX, LTE, Ev-DO, and others.

The processor 304 of the computing device 300 includes an integrated circuit die packaged within the processor 304. In some implementations of the present description, the integrated circuit die of the processor includes one or more devices, such as nanowire transistors built in accordance with implementations of the present description. The term "processor" may refer to any device or portion of a device that processes electronic data from registers and/or memory to transform that electronic data into other electronic data that may be stored in registers and/or memory.

The communication chip 306 also includes an integrated circuit die packaged within the communication chip 306. In accordance with another implementation of the present description, the integrated circuit die of the communication chip includes one or more devices, such as nanowire transistors built in accordance with implementations of the present description.

In further implementations, another component housed within the computing device 300 may contain an integrated circuit die that includes one or more devices, such as nanowire transistors built in accordance with implementations of the present description.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

It is understood that the subject matter of the present description is not necessarily limited to specific applications illustrated in FIGS. 1-18. The subject matter may be applied to other microelectronic device and assembly applications, as well as any appropriate transistor application, as will be understood to those skilled in the art.

The following examples pertain to further embodiments, wherein Example 1 is a nanowire transistor, comprising at least one nanowire channel having a first end, an opposing second end, and a top surface; a first spacer positioned proximate the at least one nanowire channel first end and a second spacer positioned proximate the nanowire channel opposing second end; a first hardmask portion abutting the first spacer and the nanowire channel top surface; and a second hardmask portion abutting the second spacer and the nanowire channel top surface.

In Example 2, the subject matter of Example 1 can optionally include a gate dielectric material abutting the nanowire channel top surface between the first hardmask portion and the second hardmask portion.

In Example 3, the subject matter of Example 2 can optionally include a gate electrode material abutting the gate dielectric material.

In Example 4, the subject matter of any of Examples 1 to 3 can optionally including the at least one nanowire channel comprising a plurality of nanowires channels formed above a microelectronic substrate, wherein the nanowire channel are space apart from one another; and wherein the first hardmask portion and the second hardmask portion abutted a top surface of a nanowire channel of the plurality of nanowire channels which is farthest from the microelectronic substrate.

In Example 5, a method of forming a microelectronic structure may comprise forming a fin structure on a microelectronic substrate, wherein the fin structure comprises at least one sacrificial material layer alternating with at least one channel material layer, and hardmask layer on a top surface of the channel material layer farthest from the microelectronic substrate; forming at least two spacers across the fin structure; selectively removing the sacrificial material layers between the channel material layers to form at least one channel nanowire; and removing the hardmask layer from between the spacers to leave a portion of the hardmask layer between the spacers and a channel nanowire top surface farthest from the microelectronic substrate.

In Example 6, the subject matter of Examples 5 can optionally comprises forming the fin structure on the microelectronic substrate, wherein the fin structure comprises at least one sacrificial material layer alternating with at least one channel material layer, and hardmask layer on the top surface of the channel material layer farthest from the microelectronic substrate, comprises: forming a microelectronic substrate: forming a stacked layer comprising at least one sacrificial material layer alternating with at least one channel material layer; forming a hardmask layer on a top surface of the channel material layer farthest from the microelectronic substrate; and forming at least one fin structure from the layered stack and the hardmask layer.

In Example 7, the subject matter of any of Examples 5 to 6 can optionally include forming a sacrificial gate electrode material between the at least two spacers; removing a portion fin structure external to the sacrificial gate electrode material and the spacers to expose portions of the microelectronic substrate; and forming a source structure and a drain structure on the substrate portions on opposing ends of the fin structure.

In Example 8, the subject matter of any of Examples 5 to 7 can optionally include forming an interlayer dielectric layer over the source structure and the drain structure; and removing the sacrificial gate electrode material from between the spacers prior to selectively removing the sacrificial material layers between the channel material layers to form the at least one channel nanowire.

In Example 9, the subject matter of any of Examples 5 to 8 can optionally include forming a gate dielectric material to surround the channel nanowire between the spacers: and forming a gate electrode material on the gate dielectric material.

In Example 10, the subject matter of any of Examples 5 to 9 can optionally include forming the hardmask layer from a material selected from the group comprising silicon, porous silicon, amorphous silicon, silicon nitride, silicon oxynitride, silicon oxide, silicon dioxide, silicon carbonitride, silicon carbide, aluminum oxide, hafnium oxide, zirconium oxide, tantalum silicate, lanthanum oxide, and polymer materials.

In Example 11, a method of forming a microelectronic structure may comprise forming a microelectronic substrate; forming a stacked layer comprising at least one sacrificial material layer alternating with at least one channel material layer: forming a first hardmask layer on a top surface of the channel material layer farthest from the microelectronic substrate; forming a second hardmask layer on the first hardmask layer; forming at least one fin structure from the layered stack, the first hardmask layer, and the second hardmask layer: removing the second hardmask layer; forming at least two spacers across the fin structure; selectively removing the sacrificial material layers between the channel material layers to form at least one channel nanowire; and removing the first hardmask layer from between the spacers to leave a portion of the first hardmask layer between the spacers and a channel nanowire top surface farthest from the microelectronic substrate.

In Example 12, the subject matter of Example 1 can optionally include forming a sacrificial gate electrode material between the at least two spacers; removing a portion fin structure external to the sacrificial gate electrode material and the spacers to expose portions of the microelectronic substrate; and forming a source structure and a drain structure on the substrate portions on opposing ends of the fin structure.

In Example 13, the subject matter of any of Examples 11 to 12 can optionally include forming an interlayer dielectric layer over the source structure and the drain structure; and removing the sacrificial gate electrode material from between the spacers prior to selectively removing the sacrificial material layers between the channel material layers to form tte at least one channel nanowire.

In Example 14, the subject matter of any of Examples 11 to 13 can optionally include forming a gate dielectric material to surround the channel nanowire between the spacers; and forming a gate electrode material on the gate dielectric material.

In Example 15, the subject matter of any of Examples 11 to 14 can optionally include forming the hardmask layer from a material selected from the group comprising silicon, porous silicon, amorphous silicon, silicon nitride, silicon oxynitride, silicon oxide, silicon dioxide, silicon carbonitride, silicon carbide, aluminum oxide, hafnium oxide, zirconium oxide, tantalum silicate, lanthanum oxide, and polymer materials.

In Example 16, the subject matter of any of Examples 11 to 15 can optionally include forming the second hardmask layer from a material selected from the group comprising silicon, porous silicon, amorphous silicon, silicon nitride, silicon oxynitride, silicon oxide, silicon dioxide, silicon carbonitride, silicon carbide, aluminum oxide, hafnium oxide, zirconium oxide, tantalum silicate, lanthanum oxide, and polymer materials.

In Example 17, a computing device may comprises a board including at least one component; wherein the at least one component includes at least one microelectronic structure comprising at least one nanowire transistor including at least one nanowire channel having a first end, an opposing second end, and a top surface; a first spacer positioned proximate the at least one nanowire channel first end and a second spacer positioned proximate the nanowire channel opposing second ends; a first hardmask portion abutting the first spacer and the nanowire channel top surface; and a second hardmask portion abutting the second spacer and the nanowire channel top surface.

In Example 18, the subject matter of Example 17 can optionally include a gate dielectric material abutting the nanowire channel top surface between the first hardmask portion and the second hardmask portion.

In Example 19, the subject matter of Example 18 can optionally include a gate electrode material abutting the gate dielectric material.

In Example 20, the subject matter of any of Examples 17 to 19 can optionally including the at least one nanowire channel comprising a plurality of nanowires channels formed above a microelectronic substrate, wherein the nanowire channel are space apart from one another; and wherein the first hardmask portion and the second hardmask portion abutted a top surface of a nanowire channel of the plurality of nanowire channels which is farthest from the microelectronic substrate.

Having thus described in detail embodiments of the present description, it is understood that the present description defined by the appended claims is not to be limited by particular details set forth in the above description, as many apparent variations thereof are possible without departing from the spirit or scope thereof.

What is claimed is:

1. A nanowire transistor, comprising:
   a plurality of nanowire channels formed above a microelectronic substrate, wherein the plurality of the nanowire channels are spaced apart from one another; wherein one nanowire channel of the plurality of nanowire channels is positioned farther from the microelectronic substrate than the remainder of the plurality of nanowire channels;
   a source abutting a first end of each nanowire channel of the plurality of nanowire channels;
   a drain abutting a second end of each nanowire channel of the plurality of nanowire channels;
   a first spacer positioned proximate the first end of each nanowire channel of the plurality of nanowire channels and a second spacer positioned proximate the second end of each nanowire channel of the plurality of nanowire channels, wherein the first spacer physically contacts each nanowire channel of the plurality of nanowire channels and wherein the second spacer physically contacts each nanowire channel of the plurality of nanowire channels;
   a hardmask layer comprising a first hardmask portion and a second hardmask portion, wherein an entirety of the hardmask layer is formed above the one nanowire channel of the plurality of nanowire channels farther from the microelectronic substrate than the remainder of the plurality of nanowire channels, wherein a hardmask material of the hardmask layer and a spacer material of the first spacer and the second spacer are different and selectively removable with respect to each other; and
   a gate dielectric material abutting a top surface of the one nanowire channel of the plurality of nanowire channels farther from the microelectronic substrate than the remainder of the plurality of nanowire channels, wherein the gate dielectric material is positioned between the first hardmask portion and the second hardmask portion;
   wherein the first hardmask portion abuts the first spacer, abuts the source, abuts the gate dielectric material, and abuts the top surface of the one nanowire channel of the plurality of nanowire channels farther from the microelectronic substrate than the remainder of the plurality of nanowire channels, such that the first hardmask portion covers a portion of the top surface of the one nanowire channel of the plurality of nanowire channels farther from the microelectronic substrate than the remainder of the plurality of nanowire channels between the source and the gate dielectric material, such that the first hardmask portion extends between the gate dielectric material and the first end of the one nanowire channel of the plurality of nanowire channels farther from the microelectronic substrate than the remainder of the plurality of nanowire channels, and separates the first spacer from the top surface of the one nanowire channel of the plurality of nanowire channels farther from the microelectronic substrate than the remainder of the plurality of nanowire channels, and wherein the second hardmask portion abuts the second spacer, abuts the drain, abuts the gate dielectric material, and abuts the top surface of the one nanowire channel of the plurality of nanowire channels farther from the microelectronic substrate than the remainder of the plurality of nanowire channels, such that the second hardmask portion covers another portion of the top surface of the one nanowire channel of the plurality of nanowire channels farther from the microelectronic substrate than the remainder of the plurality of nanowire channels between the drain and the gate dielectric material, such that the second hardmask portion extends between the gate dielectric material and the second end of the one nanowire channel of the plurality of nanowire channels farther from the microelectronic substrate than the remainder of the plurality of nanowire channels, and separates the second spacer from the top surface of the one nanowire channel of the plurality of nanowire channels farther from the microelectronic substrate than the remainder of the plurality of nanowire channels.

2. The nanowire transistor of claim 1, further including a gate electrode material abutting the gate dielectric material.

3. The nanowire transistor of claim 1, wherein the first hardmask portion and the second hardmask portion comprise a material selected from the group consisting of silicon, porous silicon, amorphous silicon, silicon nitride, silicon oxynitride, silicon oxide, silicon dioxide, silicon carbonitride, silicon carbide, aluminum oxide, hafnium oxide, zirconium oxide, tantalum silicate, lanthanum oxide, and polymer materials.

4. The nanowire transistor of claim 1, wherein the plurality of nanowire channels comprise silicon germanium.

5. The nanowire transistor of claim 1, wherein the plurality of nanowire channels comprise silicon.

6. The nanowire transistor of claim 1, wherein the source and the drain comprise n-doped silicon.

7. The nanowire transistor of claim 1, wherein the source and the drain comprise p-doped silicon.

8. The nanowire transistor of claim 1, wherein the source and the drain comprise p-doped silicon germanium.

9. The nanowire transistor of claim 1, wherein the gate dielectric material comprises a material selected from the group consisting of hafnium oxide, hafnium silicon oxide, lanthanum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium oxide, and lead zinc niobate.

10. The nanowire transistor of claim 2, wherein the gate electrode material comprises a material selected from the group consisting of titanium, tungsten, tantalum, aluminum, copper, ruthenium, cobalt, chromium, iron, palladium, platinum, molybdenum, manganese, vanadium, gold, silver, niobium, and alloys thereof.

11. The nanowire transistor of claim 2, wherein the gate electrode material comprises a metal carbide.

12. The nanowire transistor of claim 11, wherein the metal carbide comprises a material selected from the group consisting of titanium carbide, zirconium carbide, tantalum carbide, and tungsten carbide.

13. The nanowire transistor of claim 2, wherein the gate electrode material comprises a metal oxide.

* * * * *

UNITED STATES PATENT AND TRADEMARK OFFICE
CERTIFICATE OF CORRECTION

PATENT NO. : 10,121,861 B2  
APPLICATION NO. : 13/996850  
DATED : November 6, 2018  
INVENTOR(S) : Seung Hoon Sung et al.

Page 1 of 1

It is certified that error appears in the above-identified patent and that said Letters Patent is hereby corrected as shown below:

On the Title Page

After "(86) PCT No.:" replace "PCT/US13/31942" with --PCT/US13/31943--

After "(87) PCT Pub. No.:" replace "WO2014/065866" with --WO2014/142950--

After "PCT Pub. Date:" replace "May 1, 2014" with --September 18, 2014--

Signed and Sealed this  
Sixteenth Day of February, 2021

Drew Hirshfeld  
*Performing the Functions and Duties of the*  
*Under Secretary of Commerce for Intellectual Property and*  
*Director of the United States Patent and Trademark Office*